(12) United States Patent
Sargent et al.

(10) Patent No.: US 8,037,695 B2
(45) Date of Patent: *Oct. 18, 2011

(54) FAULT CURRENT LIMITER

(75) Inventors: Philip M. Sargent, Cambridge (GB);
Peter Malkin, Hexham (GB); Brian E. Simmers, Derby (GB)

(73) Assignee: Rolls-Royce plc, London (GB)

( * ) Notice: Subject to any disclaimer, the term of this patent is extended or adjusted under 35 U.S.C. 154(b) by 470 days.

This patent is subject to a terminal disclaimer.

(21) Appl. No.: 12/232,750

(22) Filed: Sep. 23, 2008

(65) Prior Publication Data

US 2009/0086386 A1    Apr. 2, 2009

Related U.S. Application Data

(63) Continuation-in-part of application No. 11/294,415, filed on Dec. 6, 2005, now Pat. No. 7,444,826, which is a continuation of application No. PCT/GB2004/002370, filed on Jun. 3, 2004.

(30) Foreign Application Priority Data

Jul. 4, 2003   (GB) .................................. 0315663.5

(51) Int. Cl.
*F25B 19/00* (2006.01)
*F25B 9/00* (2006.01)
*H02H 7/00* (2006.01)
(52) U.S. Cl. .................. 62/51.1; 62/6; 361/19
(58) Field of Classification Search .............. 62/259.2, 62/51.1, 6; 361/19, 117, 689; 174/15.4
See application file for complete search history.

(56) References Cited

U.S. PATENT DOCUMENTS 6,239,957 B1    5/2001  McDougall
7,444,826 B2 *  11/2008  Sargent et al. ............... 62/259.2

FOREIGN PATENT DOCUMENTS

| DE | 19750760 A1 | 5/1999 |
| DE | 19904822 C1 | 5/2000 |
| EP | 1217708 A1 | 6/2002 |
| JP | 4193024 A | 11/1990 |
| WO | 02103716 A1 | 12/2002 |

OTHER PUBLICATIONS

Giovanni Giunchi, "High Density MgB2 Obtained by Reactive Liquid Mg Infiltration", Congresso Nazionale Di Superconduttivita, Vietri Sul Mare, Italy, Mar. 2002.
G. Giunchi, MgB2 "Reactive Sintering From the Elements", 2003 IEEE Transactions on Applied Superconductivity vol. 13, No. 2, Jun. 2003.
M. Noe, "Supraleitende Strombegrenzer in der Energietechnik", Elektrie vol. 51 No. 11/12, 1997.

* cited by examiner

*Primary Examiner* — Chen Wen Jiang
(74) *Attorney, Agent, or Firm* — Jeffrey S. Melcher; Manelli Selter PLLC

(57) ABSTRACT

A fault current limiter comprising: an input node; an output node; a variable impedance element coupled between the input node and the output node; a closed loop cryocooler circuit, comprising a first cryocooler for cooling the variable impedance element and a second cryocooler, thermally coupled to the first cryocooler, for cooling the first coolant, wherein the variable impedance element comprises Magnesium Diboride.

16 Claims, 3 Drawing Sheets

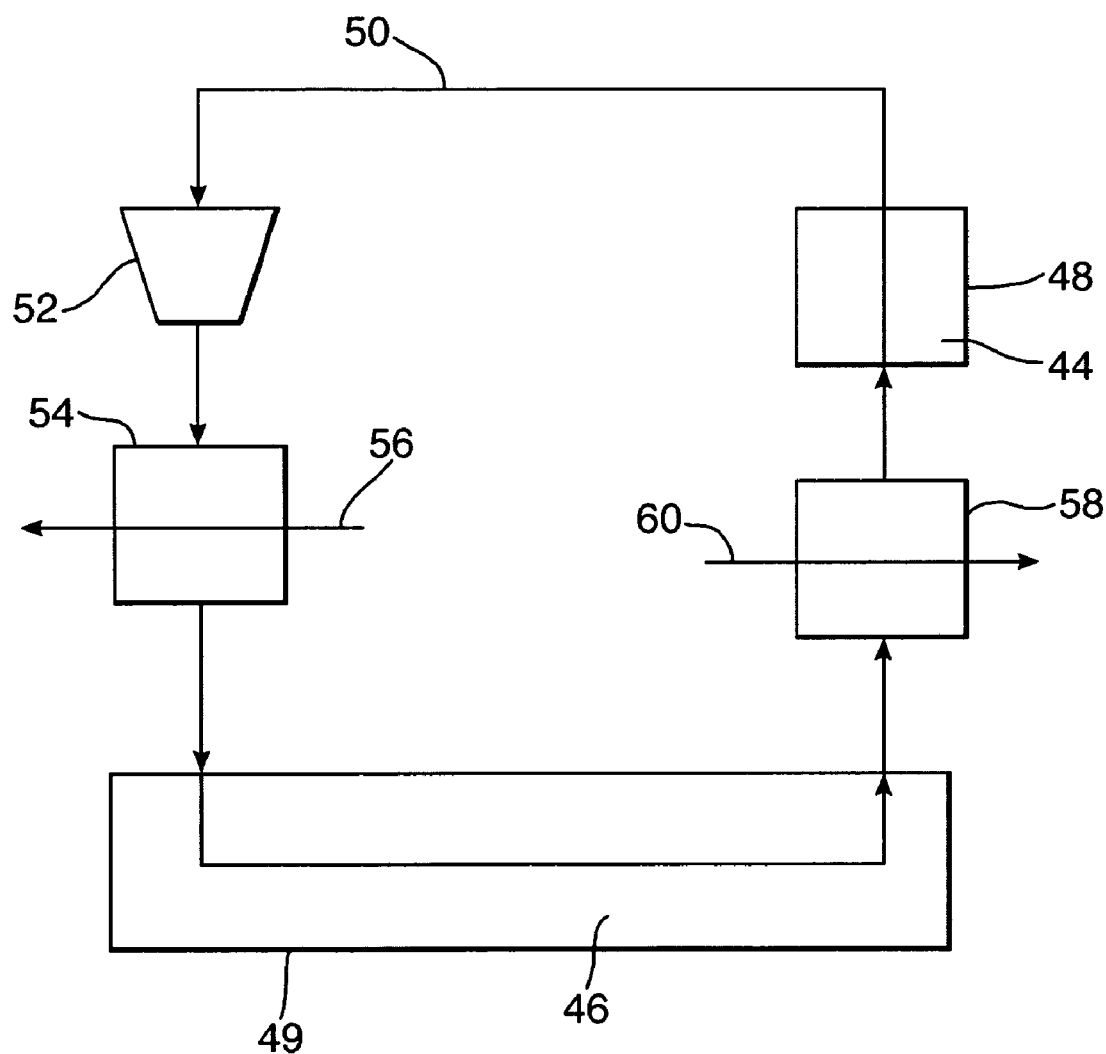

FAULT CURRENT LIMITER

CROSS-REFERENCE TO RELATED APPLICATIONS

This application is a Continuation-In-Part of National Application Number 11/294,415, now U.S. Pat. No. 7,444,826, filed Dec. 6, 2005 and currently pending, which is a Continuation of PCT/GB2004/002370, filed Jun. 3, 2004. This application also claims foreign priority to GB 0315663.5, filed Jul. 4, 2003.

BACKGROUND OF THE INVENTION

Embodiments of the present invention relate to a Fault Current Limiter (FCL). In particular, they relate to an FCL for an electricity distribution network.

Electricity distribution networks are used to transmit electric current from a source to a load. If an electrical fault occurs in such a network, large currents are generated that can cause damage to the load. Fault current limiters vary their impedance when there is a fault and reduce the current.

Superconducting materials have a low impedance superconductive state and a high impedance normal state. They can be used as a variable impedance element, in a fault current limiter. Under usual operating conditions, the superconducting element has approximately zero impedance and therefore no voltage is dropped across the FCL. When a fault occurs and a large current starts to flow, the superconducting element switches from its superconductive state to a normal state, introducing impedance into the network. A significant voltage is consequently dropped across the FCL.

Low temperature superconductors (LTS) have a transition temperature less than 23.2K. The transition temperature ($T_c$) is the temperature below which it is possible for the material to superconduct. The material superconducts when the applied magnetic field, the current density and the temperature are all below threshold values dependent upon the material type. Liquid helium must be used to cool a LTS below its transition temperature ($T_c$) but it is very costly and is an inefficient coolant. This makes an LTS expensive to use in a FCL.

Ceramic-based high temperature superconducting (HTS) materials were developed in the 1980's. HTS materials can superconduct at temperatures attainable with the use of liquid nitrogen (77 K). Liquid nitrogen is approximately 20 times more effective at cooling than liquid helium and 10 times less expensive. However, HTS materials are difficult to manufacture because of their mechanical weakness and brittle nature.

DE 199 04 822 C describes an arrangement in which liquid nitrogen is used to cool the current leads of a load such as a current limiter. The nitrogen is cooled in a Joule-Thompson refrigerating machine to a temperature of 77K and is then conveyed along the current leads in a direction counter to the incoming heat.

Therefore, it would be desirable to provide a superconductive Fault Current Limiter that can use liquid nitrogen as a coolant but has greater mechanical strength than the HTS materials.

SUMMARY OF THE INVENTION

According to the present invention there is provided a fault current limiter comprising: an input node; an output node; a variable impedance element coupled between the input node and the output node; and a multi-cycle refrigeration system, comprising a first coolant cycle which circulates a first coolant and at least one further coolant cycle which circulates a second coolant, the coolant cycles are closed cycles and are thermally coupled to cool the variable impedance element which is a superconducting material with a transition temperature in the range of 20K to 60K and further characterized in that the variable impedance element is wholly immersed in the first coolant and the first coolant cycle is wholly immersed in the second coolant.

The variable impedance element of the FCL may be arranged to switch from a superconducting state to a normal state when the current at the input node exceeds a threshold. In the superconducting state the voltage dropped across the FCL is minimal. In the normal state, the voltage dropped across the FCL may be large, and the current provided by the output node is limited.

Preferably the variable impedance element comprises a boride-based metallic superconductor material such as Magnesium Diboride.

The use of Magnesium Diboride provides several advantages. It is a superconducting material that is easy to manufacture and large quantities may be easily processed. It may also be formed into a variety of physical shapes. This provides design flexibility for the FCL. Magnesium Diboride material can be readily manufactured in any reasonable form to enable the FCL design to be optimized for any given application. Moreover, the manufacturing process leads to reliable homogeneous and repeatable samples compared to the lack of consistency with High Temperature Semiconductor (HTS) material samples. Furthermore, the cost of the $MgB_2$ material is, and is likely to remain, considerably lower than that of the HTS materials, both in terms of the raw material (powder) costs and the processing costs. Magnesium Diboride has a thermal conductivity approximately 20 times greater than that of HTS materials. This may provide rapid and uniform quenching of the superconductor making it less susceptible to damage through mechanical and thermal shock. The increase in current due to a fault in an Electricity Supply Network is large; typically hundreds of Amps to thousands of Amps, but Magnesium Diboride has the mechanical strength to withstand the very significant electromagnetically generated forces that occur in the event of a fault.

The variable impedance element may be immersed in first coolant, which has a temperature range of 5 K to 76 K. For example, the first coolant may be liquid neon and the second coolant may be liquid nitrogen. This design of FCL uses liquid neon instead of liquid helium as a coolant. Liquid neon has a specific heat capacity approximately 40 times greater than that of liquid helium.

The quench time of the variable impedance element consisting of Magnesium Diboride is fast. The quench time is the time taken for the superconducting material to go from the superconductive state to the normal state. This fast quench time provides distinct advantages. The variable impedance element quickly switches to impose a load on the Network. This reduces the likelihood of the load supplied by the Electrical power network being damaged. Additionally, it reduces the resistive heating of the variable impedance element, which consequently requires less cooling.

The variable impedance element may be electrically connected in parallel with a shunt resistor. When the current within the variable impedance element exceeds a threshold, the variable impedance element switches from its low impedance superconductive state to its high impedance normal state, causing the current to flow through the shunt resistor. The shunt resistor may transfer its heat energy directly to the environment.

The threshold current may be a current, which results in the transition current density of the superconducting element being exceeded. Alternatively, the superconducting element may be arranged or configured so that the applied magnetic field exceeds the transition magnetic field when the current exceeds the threshold current.

The transition current density is in the range of $10^3$ to $10^6$ A/cm$^2$ at liquid neon temperature (27K) and self-field. The transition current density is a function of the quality of the superconducting material. Since the upper limit of the current density is high, it allows the dimensions of the variable impedance element to be small. This is advantageous in applications where space requirements are important. One such application is in the field of an electrical marine propulsion system. In such a system, it is desirable for an FCL to be small because space is limited.

BRIEF DESCRIPTION OF THE DRAWINGS

For a better understanding of the present invention reference will now be made by way of example only to the accompanying drawings in which:

FIG. 4 illustrates a schematic diagram of a cryocooler for use with the Fault Current Limiter of the present invention.

DETAILED DESCRIPTION OF THE INVENTION

Figure 1:
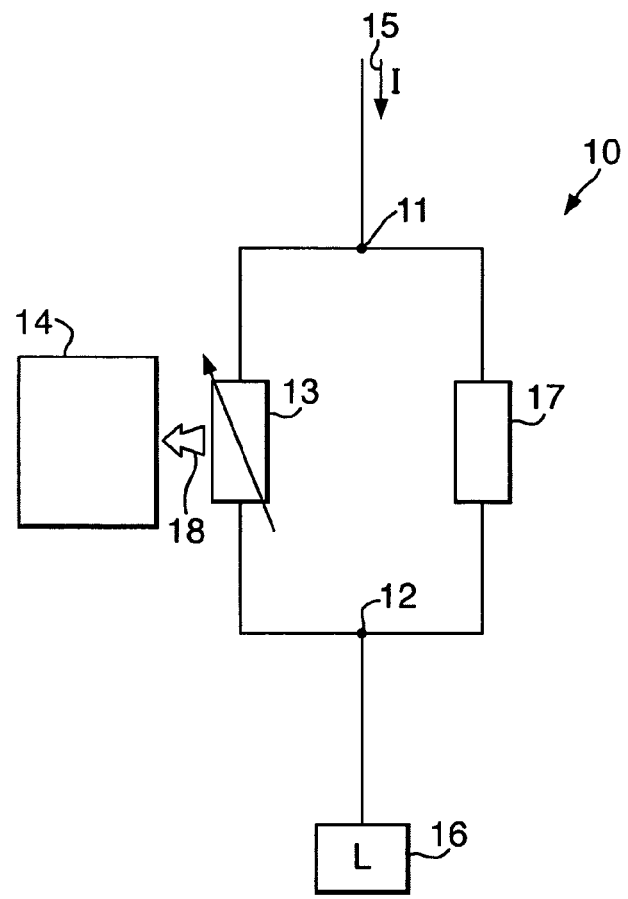
FIG. 1 illustrates a schematic circuit diagram of a Fault Current Limiter according to one embodiment of the present invention.

The figures illustrate a fault current limiter 10 comprising: an input node 11; an output node 12; a variable impedance element 13 coupled between the input node 11 and the output node 12; a multi-cycle refrigeration system 14, comprising a first coolant cycle 30 for cooling 18 the variable impedance element 13 and a second coolant cycle 32, thermally coupled 34 to the first coolant cycle 30, for cooling the first coolant 44, wherein the variable impedance element 13 comprises Magnesium Diboride.

In more detail, FIG. 1 illustrates a schematic circuit diagram of a fault current limiter 10 for limiting a current I 15 provided to a load 16 when the current I exceeds a threshold value. The fault current limiter 10 comprises a variable impedance element 13, an input node 11, an output node 12, a multi-cycle refrigeration system 14 and a shunt resistor 17. The variable impedance element 13 is electrically connected between the input node 11 and the output node 12. The resistor 17 is electrically connected between the input node 11 and the output node 12, in parallel with the variable impedance element 13. The load 16 is electrically connected to the output node 12. The variable impedance element 13 is thermally coupled 18 to the multi-cycle refrigeration system 14. Heat is transferred 18 from the variable impedance element 13 to the multi-cycle refrigeration system 14.

In usual operation, when the current I has not exceeded a threshold because of a fault, the variable impedance element 13 acts as a superconductor and has effectively zero impedance. The resistor 17 has a large (fixed) resistance. Therefore the current I 15 (typically hundreds of Amps) flows from the input node 11 through the variable impedance element 13, to the output node 12 and is provided to the load 16. The voltage dropped between the input node 11 and the output node 12 is minimal.

If a fault occurs, causing the current I 15 at the input node 11 to go beyond a threshold value (typically thousands of Amps), the variable impedance element 13 switches from its low impedance superconductive state to its high impedance normal state. Thermal energy is transferred 18 from the variable impedance element 13 to the multi-cycle refrigeration system 14, reducing the likelihood of damage to the variable impedance element 13 through thermal shock. When the variable impedance element 13 switches from its low impedance superconducting state to its high impedance normal state, the current I is switched to flow through the resistor 17. The thermal energy generated in the resistor 17 by the current is transferred to the environment. Therefore when a fault occurs, the fault current limiter 10 goes from having low (approximately zero) impedance to high impedance the same as or close to that of the resistance of resistor 17. The resistor 17 may be chosen so that it limits the current in the circuit to no more than 3 times the full-load current (the maximum operating current of the load).

The variable impedance element 13 does not provide the impedance of the FCL 10 when there is a fault, the resistor 17 does and its thermal energy is directly transferred to the environment. The quench time of the variable impedance element 13 is low. This allows it to switch quickly between its low impedance superconducting state and its high impedance normal state.

The fault current limiter illustrated in FIG. 1 has the parallel connected variable impedance element 13 and resistor 17 connected in the current path to the load 16. In an alternative embodiment, a primary inductor is connected between the input and output nodes in the current path and the parallel connected variable impedance element 13 and resistor 17 are connected in series with a secondary inductor magnetically coupled to the primary inductor. When the current through the primary inductor raises the current induced in the secondary inductor rises. This secondary circuit can switch the state of the variable impedance element and limit the current flowing through the primary inductor.

Figure 2:
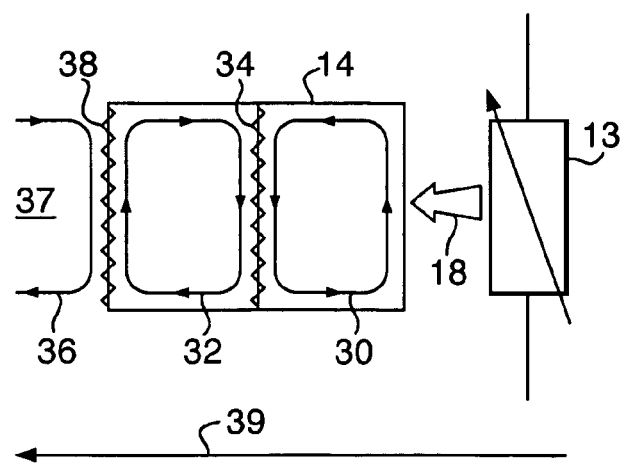
FIG. 2 illustrates a schematic diagram of the thermal energy transfer from the variable impedance element to the environment via a multi-cycle refrigeration system.

FIG. 2 illustrates a variable impedance element 13, thermally coupled to a multi-cycle refrigeration system 14 so that heat from the variable impedance element 13 is transferred to the environment 37. The multi-cycle refrigeration system 14 comprises a first coolant cycle 30; a second coolant cycle 32, a first thermal couple 34 and a second thermal couple 38. The first coolant cycle 30 circulates a first coolant and is physically separated from the second coolant cycle 32 by the first thermal couple 34. The second coolant cycle 32 circulates a second coolant and is physically separated from the environment 37 by the second thermal couple 38. The first coolant cycle 30 and the second coolant cycle 32 are closed cycles, not open to the environment 37.

Thermal energy is transferred 18 from the variable impedance element 13 to the first coolant cycle 30. The thermal energy is then transferred from the first coolant cycle 30 to the second coolant cycle 32 via the first thermal couple 34. Thermal energy is finally transferred 36 from the second coolant cycle 32 to the environment 37 via a second thermal couple 38. The resultant transferal of thermal energy is indicated by arrow 39. Thus, thermal energy is transferred from the variable impedance element 13 to the environment 37, via 2 closed coolant cycles. Although, the diagram illustrates the use of two closed cycles, it is possible to use more than two closed cycles connected serially.

Figure 3:
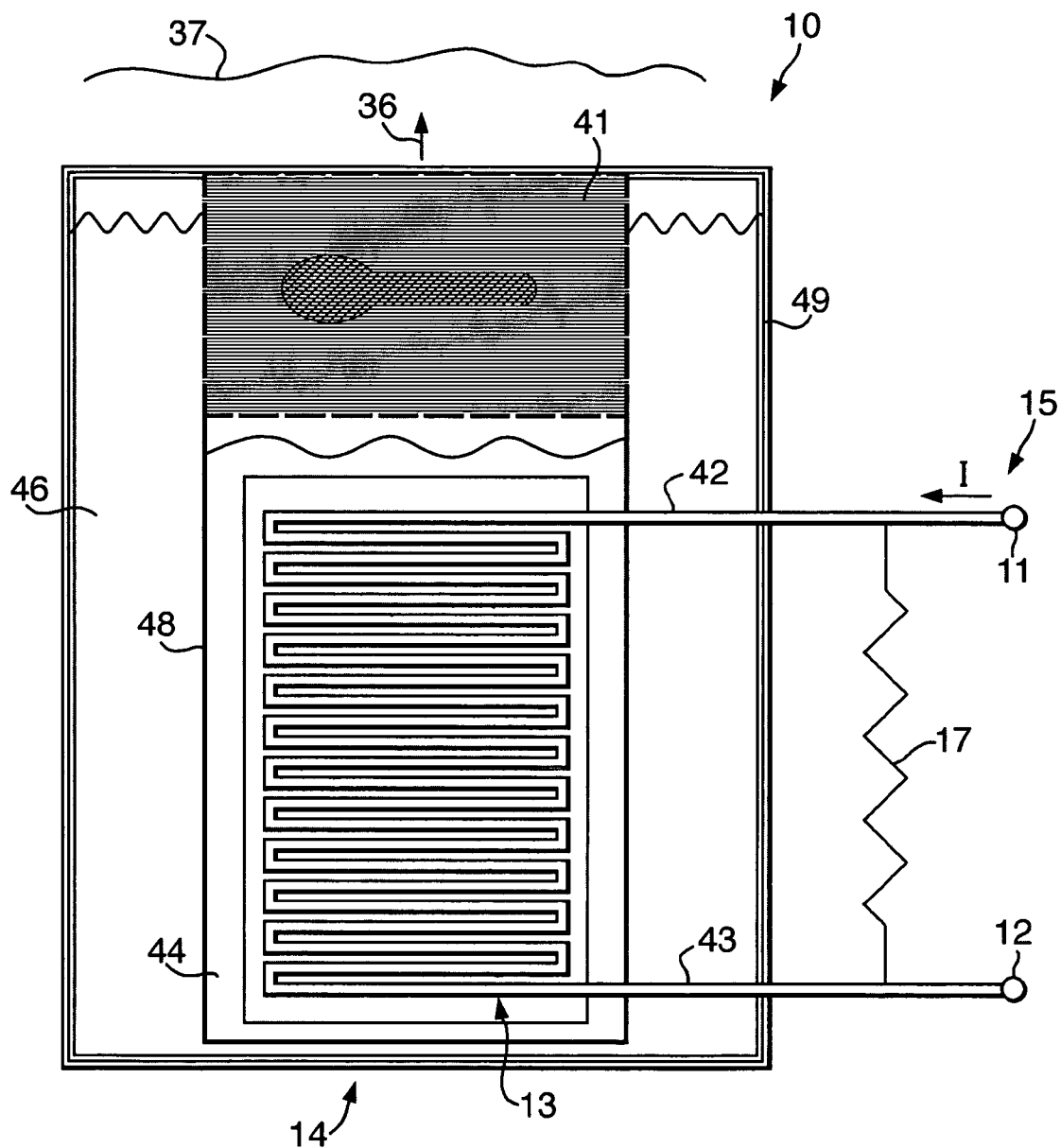
FIG. 3 illustrates a Fault Current Limiter according to one embodiment of the present invention.

FIG. 3 illustrates a fault current limiter 10 comprising an input node 11, an output node 12, a variable impedance element 13 coupled between the input node 11 and the output node 12 and a multi-cycle refrigeration system 14, comprising a first coolant 44 for cooling the variable impedance element 13 and a second coolant 46, for cooling the first coolant 44, wherein the variable impedance element 13 comprises superconducting material with a transition temperature in the range of 20K to 60K, and the second coolant 46 is liquid nitrogen, whereby the electrical impedance of the variable impedance element 13 varies when the electrical current 15 provided to the input node 11 exceeds a threshold causing a transition of the variable impedance element 13 from a superconductive state to a normal state.

In more detail, in FIG. 3, the fault current limiter 10 comprises an input node 11, an output node 12, a variable impedance element 13, a fixed resistor 17, a first interconnect 42, a second interconnect 43 and a multi-cycle refrigeration system 14. The multi-cycle refrigeration system 14 comprises a first closed container 48 housing a first coolant 44, a second closed container 49 housing the first closed container immersed in a bath of second coolant 46 and a heat exchanger 41.

The first interconnect 42 electrically connects one end of the variable impedance element to the input node 11 and the second interconnect 43 connects the other end of the variable impedance element to the output node 12. The resistor 17 is connected between the input node and output node in parallel with the series combination of first interconnect 42, variable impedance element 13 and second interconnect 43.

The variable impedance element 13 is immersed in the first coolant 44 within the first closed container 48. The variable impedance element 13 is physically connected to the first interconnect 42 and to the second interconnect 43 at the wall of the first container. The first and second interconnects 42 and 43 pass through the second coolant 46 before emerging through the wall of the second closed container 49, where they are electrically connected to opposite ends of the resistor 17. Thus the variable impedance element 13 is wholly immersed in the first coolant 13 and the resistor 17 is external to the multi-cycle refrigeration system 14.

The first coolant 44 is physically separated from the second coolant 46, by a first thermal couple 34 (not shown) within the heat exchanger 41, and moves by convection to form a first coolant cycle 30. The second coolant is physically separated from the atmosphere 37 by a second thermal couple 38 (not shown) also within the heat exchanger 41, and moves by convection to form the second coolant cycle 32. The heat exchange transfers thermal energy from the first coolant cycle 30 to the second coolant cycle 32 and then to the environment 37.

The second closed container 49 is a cryostat and the first closed container 48 is a glass vessel.

In a preferred embodiment, the variable impedance element is a Magnesium Diboride superconducting element. Magnesium Diboride ($MgB_2$) is easy to manufacture and can be produced in any quantity and any form. It is less susceptible to thermal and mechanical shock than a HTS. It has a $T_c$ of about 39K. The first coolant is liquid neon (~27K) and the second coolant is liquid nitrogen (~77K). The transition current density ($J_c$) is in the range of $10^3$ to $10^6$ A/cm$^2$ at liquid neon temperatures (27K) and self-field.

FIG. 4 illustrates a preferred embodiment of the multi-cycle refrigeration cycle 14 of the present invention comprising a closed loop cryocooler circuit. The working fluid 50 may be helium, preferably liquid helium. Alternatively, it may be wholly gaseous or a mixture of gas and liquid phases. Exemplary temperatures are given for helium working fluid 50. The working fluid 50 is pumped around a closed loop by a powered compressor 52. The working fluid 50 exits the compressor 52 at a typical temperature of 120K. It then passes through a first cryocooler 54 where it exchanges heat with a flow of cooled heat exchange fluid 56. Preferably the heat exchange fluid 56 is water or water with additive chemicals such as glycerol, where available, or ambient air. The former is more preferable since it does not require a heat spreader or fan arrangement, and so water is used where possible. This is particularly advantageous in a marine application having a plentiful supply of water. The first cryocooler 54 provides active cooling and may therefore also include means to change the pressure of the working fluid 50 to reduce its temperature further than would be possible in an equivalent passive heat exchanger. The first cryocooler 54 typically reduces the temperature of the working fluid 50 to around 60K.

On exiting the first cryocooler 54, working fluid 50 passes through the second closed container, or dewar, 49 where it extracts heat from the second coolant 46. Where the second coolant 46 is liquid nitrogen, the working fluid 50 exits the second coolant bath 49 with a temperature in the region of 77K. It is then passed through a second cryocooler 58 where it exchanges heat with a flow of heat exchange fluid 60. As with the first cryocooler 54, the heat exchange fluid 60 is further cooled and is typically water, water with additive chemicals or ambient air and will reduce the temperature of the working fluid 50 to around 20K.

The working fluid 50 is then passed through the first closed container, or dewar, 48 containing the first coolant 44. Where the first coolant 44 is liquid neon, the temperature of the working fluid 50 is raised to around 29K. It then flows back around to the compressor 52 to begin the cycle again.

The arrangement of the present invention, comprising the immersion, preferably total immersion, of the first coolant cycle 30 within the second coolant 46, is highly advantageous. In both marine power applications and power distribution applications the equipment is relatively remote and/or inaccessible so there is a requirement for all electrical systems to need little and infrequent maintenance work. Both coolant cycles are closed cycle. Preferably the first coolant 44 is liquid neon and the second coolant 46 is liquid nitrogen so that the liquid neon cycle is wholly immersed within the liquid nitrogen. This means that gasification and dispersion of the neon during quench and recovery time of the variable impedance element 13 is minimized. Therefore, little or none of the liquid neon escapes and so it rarely needs topping up. This is beneficial in terms of maintenance intervals and cost, since liquid neon is relatively costly. Similarly, since the liquid nitrogen is also used in closed second coolant cycle 32, little is lost and there are consequent reductions in cost and maintenance intervals.

Although a particular multi-cycle refrigeration system 14 has been described with respect to FIG. 4, other arrangements may be substituted with equal felicity. For example, a Stirling, Gifford-McMahon or Joule-Thomson cycle could be used, or any suitable combination of two or more of these. Alternatively, different heat exchange fluids and coolants may be used. For example, the liquid neon may be replaced by gaseous helium or liquid hydrogen and the liquid helium may be replaced by gaseous helium.

In order to increase the thermal stability of the multi-cycle refrigeration system 14 it is important for the first coolant 44 to be fluid meaning that it is partially liquid and partially gaseous throughout the heat exchange with the working fluid 50. The system should be sized to ensure there is some liquid neon in contact with the variable impedance superconducting element 13 at all times as well as some gaseous neon in the system, typically 75-80% liquid and 20-25% gaseous. Thus heat from the variable impedance element 13 is dissipated to the liquid neon by latent heat so that the liquid become gaseous neon. This phase change maintains the temperature of the neon and therefore ensures that the critical current of the variable impedance element 13 is a constant value. The gaseous neon rises to meet a cold plate, chilled to around 20K, which causes the neon to condense into liquid and then to fall back towards the element 13 for the cycle to repeat. Since at least some of the working fluid 50 will experience phase change during the heat transfer, the thermal contact with the liquid neon maintains the temperature at a more constant value.

By wholly immersing the variable impedance element 13 in the fluid first coolant 44, the cooling efficiency is high. This means that the physical size of the first coolant cycle 30 can be minimized and, hence, a minimal quantity of liquid neon is required, reducing cost. The first coolant cycle 30 is wholly immersed in the second coolant 46 so the physical size of the second coolant cycle 32 may also be reduced with similar benefits. Thus, the complete system is smaller than prior art systems and yet provides more efficient cooling of the superconducting element.

The portions of the first and second interconnect that pass through the second coolant may be formed from a high temperature superconductor (HTS). A HTS has a low thermal conductivity, but a high electrical conductivity in the superconducting state. The use of the HTS as part of the interconnects therefore reduces the work required in cooling the first coolant 44 and therefore allows the fault current limiter 10 to be of a smaller size. The HTS interconnects are arranged so that the variable impedance element 13 is switched from its superconductive low impedance state to its high impedance normal state at a current threshold that does not switch the state of the superconductive HTS interconnects 42, 43.

The cross-sectional area of the variable impedance element and the transition current density of the superconducting material determine the threshold current at which the variable impedance element switches from the low impedance state to the high impedance state. Thus variable impedance elements 13 of different cross-sectional area may be used for different threshold currents. The length of variable impedance element 13 is chosen so that its impedance in the high impedance state is very much greater than that of the resistor 17. This minimizes resistive heating of the first coolant 44. The serpentine or switch-back configuration of FIG. 3 is suitable for such a current switched variable impedance element.

An extremely wide variety of quench times can be engineered as Magnesium Diboride can be fabricated in a wide variety of shapes with quench propagation being arranged to occur either lengthwise or crosswise through a conductor. The serpentine or switch-back configuration of FIG. 3 enables multiple quench starting points to be triggered by sections of the superconducting variable impedance element that are close thermally but distant electrically.

In an alternative embodiment, the variable impedance element may be configured so that it is subject to an increasing magnetic field as the current through the variable impedance element increases The increasing magnetic field itself or the increasing magnetic field and the increasing electrical current in combination may be used to switch the variable impedance element 13 from its low impedance state to a high impedance state. For example, the variable impedance element may be configured as a solenoid.

The effect that magnetic flux density has on $J_c$ depends on the material production route and additives (an increase in magnetic flux density from self-field to 0.3 T can be insignificant or reduce $J_c$ by a factor of up to 50).

Magnesium Diboride material can be readily manufactured in any reasonable form to enable the FCL design to be optimized for any given application. Moreover the manufacturing process leads to reliable homogeneous and repeatable samples compared to the lack of consistency with High Temperature Superconductor (HTS) material samples. Furthermore, the cost of the $MgB_2$ material is, and is likely to remain, considerably lower than that of the HTS materials, both in terms of the raw material (powder) costs and the processing costs.

Although embodiments of the present invention have been described in the preceding paragraphs with reference to various examples, it should be appreciated that modifications to the examples given can be made without departing from the scope of the invention as claimed. For example, the multi-cycle refrigeration system 14 may have one or more intermediate coolant cycles situated between the first coolant cycle 30 and the second coolant cycle 32. Additionally, Magnesium Diboride need not necessarily be used as the superconducting element in the variable impedance element 13. Other superconducting materials may be suitable given similar properties for their transition temperatures\current densities\magnetic flux densities and quench times. Superconducting materials which may be described as 'Boride-based materials—metallic superconductors with substantial conventional metallic bonding and electrical conductivity in the non-superconducting state' may also be suitable for use.

The invention claimed is:

1. A fault current limiter comprising:
   an input node;
   an output node;
   a variable impedance element coupled between the input node and the output node;
   characterized in that a closed loop cryocooler circuit is provided comprising a first cryocooler which circulates a first coolant and at least one further cryocooler which circulates a second coolant, the cryocoolers are thermally coupled to cool the variable impedance element which is a super conducting material with a transition temperature in the range of 20K to 60K;
   and further characterized in that the variable impedance element is wholly immersed in the first coolant and the first cryocooler is wholly immersed in the second coolant.

2. A fault current limiter as claimed in claim 1 characterized in that the variable impedance element comprises a Boride-based metallic superconductor material.

3. A fault current limiter as claimed in claim 2 characterized in that the variable impedance element is made from Magnesium Diboride.

4. A fault current limiter as claimed in claim 3 characterized in that the first coolant is in the temperature range of 5K to 76K.

5. A fault current limiter as claimed in claim 4 characterized in that the first coolant is liquid neon.

6. A fault current limiter as claimed in claim 1 characterized in that the variable impedance element is configured such that when the electrical current provided to the input node exceeds a threshold, the current density in the variable impedance element exceeds a transition current density and the variable impedance element switches from a low impedance superconductive state to a high impedance normal state.

7. A fault current limiter as claimed in claim 6 characterized in that the transition current density is in the range of $10^3$ to $10^6$ A/cm$^2$ at 27K.

8. A fault current limiter as claimed in claim 1 characterized in that the variable impedance element is configured such that when a magnetic flux density in the variable impedance element exceeds a transition magnetic flux density the variable impedance element switches from a low impedance superconductive state to a high impedance normal state.

9. A fault current limiter as claimed in claim 1 characterized in that at least one high temperature superconductor interconnect is connected in series with the first variable impedance element.

10. A fault current limiter as claimed in claim 9 characterized in that first and second high temperature superconductive interconnects connect the variable impedance element in the fault current limiter.

11. A fault current limiter as claimed in claim 9 in which the high temperature superconductor interconnects are immersed in a coolant in the second coolant portion.

12. A fault current limiter as claimed in claim 1 characterized in that the coolant in the second coolant portion is liquid nitrogen.

13. A fault current limiter as claimed in claim 1 characterized in that a resistor is electrically connected in parallel with the variable impedance element.

14. A fault current limiter as claimed in claim 13 characterized in that the resistor is located outside the closed loop cryocooler circuit and the variable impedance element is located inside the closed loop cryocooler circuit.

15. A fault current limiter as claimed in claim 1 characterized in that the variable impedance element is arranged in a resistive configuration.

16. A fault current limiter as claimed in claim 1 characterized in that the variable impedance element is arranged in an inductive configuration.

* * * * *